(12) United States Patent
Blondin et al.

(10) Patent No.: US 9,401,697 B2
(45) Date of Patent: Jul. 26, 2016

(54) DEVICE FOR GENERATING AN ALTERNATING VOLTAGE DIFFERENCE BETWEEN THE REFERENCE POTENTIALS OF ELECTRONIC SYSTEMS

(75) Inventors: Christophe Blondin, Nimes (FR); Christian Neel, Nimes (FR); Didier Roziere, Nimes (FR)

(73) Assignee: QUICKSTEP TECHNOLOGIES LLC, Wilmington, DE (US)

( * ) Notice: Subject to any disclaimer, the term of this patent is extended or adjusted under 35 U.S.C. 154(b) by 283 days.

(21) Appl. No.: 14/125,643

(22) PCT Filed: Jun. 8, 2012

(86) PCT No.: PCT/FR2012/051289
§ 371 (c)(1),
(2), (4) Date: Jan. 16, 2014

(87) PCT Pub. No.: WO2012/172240
PCT Pub. Date: Dec. 20, 2012

(65) Prior Publication Data
US 2014/0145732 A1    May 29, 2014

(30) Foreign Application Priority Data
Jun. 16, 2011  (FR) ...................................... 11 55287

(51) Int. Cl.
*G01R 27/26* (2006.01)
*H03K 3/012* (2006.01)
*G06F 3/044* (2006.01)

(52) U.S. Cl.
CPC ............ *H03K 3/012* (2013.01); *G01R 27/2605* (2013.01); *G06F 3/044* (2013.01)

(58) Field of Classification Search
CPC .................... H03K 19/0826; H03K 19/09429; H03K 3/12; H03K 2217/96077; H03K 17/9525; H03K 17/9532; G01R 27/2605

USPC .............. 324/647, 679; 327/108; 331/21, 71, 331/172, 285
See application file for complete search history.

(56) References Cited

U.S. PATENT DOCUMENTS 3,656,065 A     4/1972  Reinhard et al.
3,984,757 A *  10/1976  Gott ..................... H03K 17/962
                                                          315/246

(Continued)

FOREIGN PATENT DOCUMENTS

EP    2131202 A1    9/2009
FR    2693555 A1    1/1994

(Continued)

OTHER PUBLICATIONS

International Search Report, dated Aug. 21, 2012, from corresponding PCT application.

(Continued)

*Primary Examiner* — Patrick Assouad
*Assistant Examiner* — Sean Curtis
(74) *Attorney, Agent, or Firm* — Morrison & Foerster LLP (57) ABSTRACT

The present invention relates to a device for generating an alternating voltage difference between a first and second reference potential. The device comprises: an oscillator electrically referenced to the first reference potential; and a voltage follower/amplifier device electrically referenced to the second reference potential and having an input connected to the oscillator and an output connected to the first reference potential such that it can impose an alternating voltage difference, which depends on the signal generated by the oscillator, between said first and second reference potentials. The invention also relates to a system that uses the device and to a method for generating an alternating voltage difference between a first and second reference potential.

15 Claims, 4 Drawing Sheets

(56) References Cited

U.S. PATENT DOCUMENTS

| | | | |
|---|---|---|---|
| 3,988,669 A | 10/1976 | Fasching | |
| 4,149,231 A * | 4/1979 | Bukosky | G01F 23/266 324/678 |
| 5,041,817 A * | 8/1991 | Reeb | G01R 31/006 317/10.1 |
| 5,095,224 A * | 3/1992 | Renger | H02M 7/48 310/319 |
| 5,173,685 A * | 12/1992 | Nimmo | B60Q 11/00 307/10.8 |
| 6,127,899 A * | 10/2000 | Silva | H03B 29/00 331/117 FE |
| 6,429,700 B1 * | 8/2002 | Yang | H03F 3/45511 327/108 |
| 7,151,417 B1 * | 12/2006 | Suzuki | G01R 31/2884 331/185 |
| 7,288,945 B2 * | 10/2007 | Martinez | H03K 17/955 324/663 |
| 7,525,348 B1 * | 4/2009 | Ziazadeh | H03K 5/2481 327/103 |
| 7,589,596 B2 * | 9/2009 | Masuda | H03B 5/1265 331/167 |
| 7,961,055 B2 * | 6/2011 | Miyata | H03L 5/00 331/116 FE |
| 7,986,194 B2 * | 7/2011 | Kiyohara | H03B 5/36 331/116 FE |
| 8,149,002 B2 * | 4/2012 | Ossart | G01B 7/08 324/662 |
| 8,222,885 B2 * | 7/2012 | Kirchmeier | H01J 37/32045 323/271 |
| 8,436,687 B2 * | 5/2013 | Aruga | H03K 3/354 331/135 |
| 8,933,710 B2 * | 1/2015 | Blondin | G06F 3/044 324/658 |
| 8,963,372 B2 * | 2/2015 | Takano | H02M 7/483 307/130 |
| 2004/0125918 A1 | 7/2004 | Shanmugavel et al. | |
| 2005/0030683 A1 * | 2/2005 | Tailliet | H02M 3/073 361/18 |
| 2005/0146377 A1 * | 7/2005 | Owen | G05F 3/245 327/541 |
| 2008/0231292 A1 * | 9/2008 | Ossart | G01B 7/08 324/688 |
| 2008/0246511 A1 * | 10/2008 | Miura | H03F 3/48179 326/83 |
| 2009/0027937 A1 * | 1/2009 | Kirchmeier | H01J 37/32045 363/133 |
| 2010/0135051 A1 * | 6/2010 | Mallwitz | H02M 7/5387 363/40 |
| 2011/0133788 A1 * | 6/2011 | Liu | H03K 19/018528 327/108 |
| 2011/0193848 A1 * | 8/2011 | Kojima | G09G 3/3614 345/211 |
| 2013/0323942 A1 * | 12/2013 | Blondin | H03K 17/691 439/39 |
| 2014/0103712 A1 * | 4/2014 | Blondin | H02M 7/06 307/18 |
| 2014/0125357 A1 * | 5/2014 | Blondin | G06F 3/044 324/658 |
| 2014/0145732 A1 * | 5/2014 | Blondin | G01R 27/2605 324/679 |

FOREIGN PATENT DOCUMENTS

| | | | | |
|---|---|---|---|---|
| FR | 2756048 A1 | 5/1998 | | |
| WO | WO 2012172240 A1 * | 12/2012 | | G01R 27/2605 |
| WO | WO 2012172241 A1 * | 12/2012 | | G06F 3/044 |

OTHER PUBLICATIONS

French Search Report, dated Apr. 12, 2012, from corresponding FR application.

* cited by examiner

Prior art

DEVICE FOR GENERATING AN ALTERNATING VOLTAGE DIFFERENCE BETWEEN THE REFERENCE POTENTIALS OF ELECTRONIC SYSTEMS

TECHNICAL FIELD

The present invention relates to an oscillator device with a separate buffer, making it possible to generate an alternating voltage difference between the reference potentials of electronic systems.

The field of the invention is more particularly, but non-limitatively, that of electronic testing and measurement devices.

STATE OF THE PRIOR ART

In general, electronic systems are referenced with respect to a ground potential, which can for example be a voltage reference with respect to which the power supply voltages are fixed. This ground may or may not be connected to the earth.

In certain cases, it is necessary that electronic parts or sub-systems are referenced to potentials different from the ground potential of the overall system and floating or variable with respect to the latter. This situation is encountered for example in measurement systems, in order to be free of electrical interference related to noise sources.

Sometimes, the floating part is not totally separated from the rest of the system by galvanic isolation but it is floating or variable only within a range of frequencies, or around a working frequency.

In certain systems in particular, an oscillator is inserted between the reference potential of the floating part and the ground potential. It imposes an alternating voltage difference between these two reference potentials, thus causing the floating potential to "float" with respect to the ground potential (or vice-versa).

This situation is encountered for example in the document FR 2 756 048 by Rozière, which discloses a capacitive measuring system. The detection circuit comprises a part that floats in a range of frequencies and the reference potential of which oscillates with respect to the ground of the overall system at an oscillation frequency.

This type of circuit presents the problem of interfacing between the parts referenced to different reference potentials, including in particular:
  the generation of the alternating voltage difference between the reference potentials,
  the power supply of the floating part,
  the transfer of the test and measurement signals, digital or analogue, between the parts having different reference potentials.

As explained previously, the alternating voltage difference between the reference potentials can be generated by means of an oscillator connected to the two reference potentials, in such a way as to impose a potential difference between them. In theory, this oscillator can be referenced in a substantially equivalent manner to the ground potential or to the floating potential.

However, it is often preferable for the oscillator to be referenced to the floating potential, because it is also used as an internal oscillator for the floating part. This situation is encountered in particular in FR 2 756 048.

The problem which then arises is that this oscillator must be capable of delivering sufficient current (or power), and therefore must be supplied by an electrical supply source of sufficient power referenced to the floating potential.

It is known to supply the floating part with supply sources referenced to the ground potential, which are more easily available, by transmitting the supply voltages between the parts referenced to the ground and the floating parts using inductance coils or chokes placed in series on the lines, so as to present a high impedance at the oscillation frequency of the floating reference potential, or by other means such as DC/DC converters.

Similar principles can moreover also be used for transmitting digital or analogue signals.

In numerous present-day applications, electronic functions must be produced in the form of integrated electronic circuits having minimal overall dimensions and minimal electrical consumption. This is particularly true for capacitive measuring systems which are increasingly used for producing touch-sensitive interfaces of portable systems (telephones, computers, etc.).

In this context, the known means for transmitting the power supplies (and the signals) between the floating and non-floating parts have objectionable drawbacks, such as large overall dimensions and high consumption.

These drawbacks are particularly important with regard to the electrical power supply of the floating parts or parts having variable reference potentials. In fact, the inductances (chokes) and other DC/DC converters are particularly penalizing for the production of integrated circuits.

It is therefore important to limit the electrical consumption of the floating part as much as possible in order to be able to have recourse to power supply arrangements that are less penalizing in terms of integration. However, an oscillator such as produced in the devices of the prior art has particularly high energy consumption and is therefore penalizing from this point of view.

A purpose of the present invention is to propose a device and a method for generating an alternating voltage difference between electrical reference potentials, which makes it possible to minimize the electrical consumption of a part having a variable reference potential.

Another purpose of the present invention is to propose a device and a method for generating an alternating voltage difference between electrical reference potentials, allowing the use of arrangements for supplying a part having a variable reference potential and which are not very penalizing in terms of integration of components.

DESCRIPTION OF THE INVENTION

This objective is achieved with a device for generating an alternating voltage difference between a first and a second reference potential, comprising an oscillator electrically referenced to the first reference potential, characterized in that it comprises moreover a voltage follower/amplifier device electrically referenced to the second reference potential and having an input connected to the oscillator and an output connected to the first reference potential in such a way as to be able to impose an alternating voltage difference, which depends on the signal generated by the oscillator, between said first and second reference potentials.

The term "connected" must of course be interpreted in the sense that components connected together can be connected directly, though a direct electrical link, or connected via additional electrical or electronic components.

The voltage follower/amplifier device can comprise an operational amplifier, configured as a voltage follower or having any gain whatsoever.

Depending on the embodiments, the device according to the invention can moreover comprise:

a voltage divider inserted between the oscillator and the input of the voltage follower/amplifier device;

at least one resistor inserted between the oscillator and the input of the voltage follower/amplifier device, and at least one resistor inserted between the input of the voltage follower/amplifier device and the second reference potential.

The device according to the invention can comprise moreover power supply transfer means able to generate, at a power supply output, an electrical power supply referenced to the first reference potential, from a primary power supply source referenced to the second reference potential.

It can comprise moreover an electric circuit connecting the terminals of the primary power supply source through the output of the voltage follower/amplifier device.

This configuration is possible because the voltage follower/amplifier device controlled by the oscillator behaves substantially as a perfect voltage generator, also called a Thevenin generator. It makes it possible to impose an alternating voltage difference between the first and second reference potentials, which makes it possible to keep them variable or floating with respect to each other, whilst presenting a very low impedance to the supply current. This result could not be obtained without the presence of the voltage follower/amplifier device controlled by the oscillator.

According to an embodiment, the device according to the invention can comprise moreover power supply transfer means arranged as a voltage raising chopper device, comprising:

an inductance connected to a primary substantially DC power supply source, a switch connected, respectively, to the inductance and to the second reference potential, so as to be able to open and close the circuit in a cyclic manner (periodic or non-periodic), a diode connected, respectively, to the inductance and to a power supply output, and filtering means, comprising at least one filtering capacitor connected to the power supply output and to the first reference potential, respectively.

According to another embodiment, the device according to the invention can comprise moreover power supply transfer means arranged as a voltage-raising rectifier, comprising:

a load capacitor connected to a bipolar alternating primary power supply source, a first diode connected, respectively, to the first reference potential and to the load capacitor, a second diode connected, respectively, to the load capacitor and to the power supply output, and filtering means comprising at least one filtering capacitor connected to the power supply output and to the first reference potential, respectively.

The device according to the invention can be produced using integrated electronics technologies.

According to another aspect, there is proposed an electronic capacitive measuring system comprising a first sub-system electrically referenced to a guard potential, a second sub-system electrically referenced to a ground potential, and an oscillator referenced to said guard potential, said system comprising moreover a device according to the invention for imposing between said ground and guard potentials an alternating voltage difference which depends on the signal generated by the oscillator.

The electronic capacitive measuring system according to the invention can comprise moreover a charge amplifier referenced to the guard potential and supplied by power supply transfer means according to the invention.

According to yet another aspect, there is proposed a method for generating an alternating voltage difference between a first and a second reference potential, comprising a step of generation of a signal by means of an oscillator electrically referenced to the first reference potential, said method comprising moreover a step of amplification of said signal, by means of a voltage follower/amplifier device electrically referenced to the second reference potential and having an input connected to the oscillator and an output connected to the first reference potential, in such a way as to impose between said first and second reference potentials an alternating voltage difference depending on said signal generated by the oscillator.

DESCRIPTION OF THE FIGURES AND EMBODIMENTS

Other advantages and characteristics of the invention will become apparent on examination of the detailed description of an embodiment which is in no way limitative, and the attached diagrams, in which.

Figure 1:
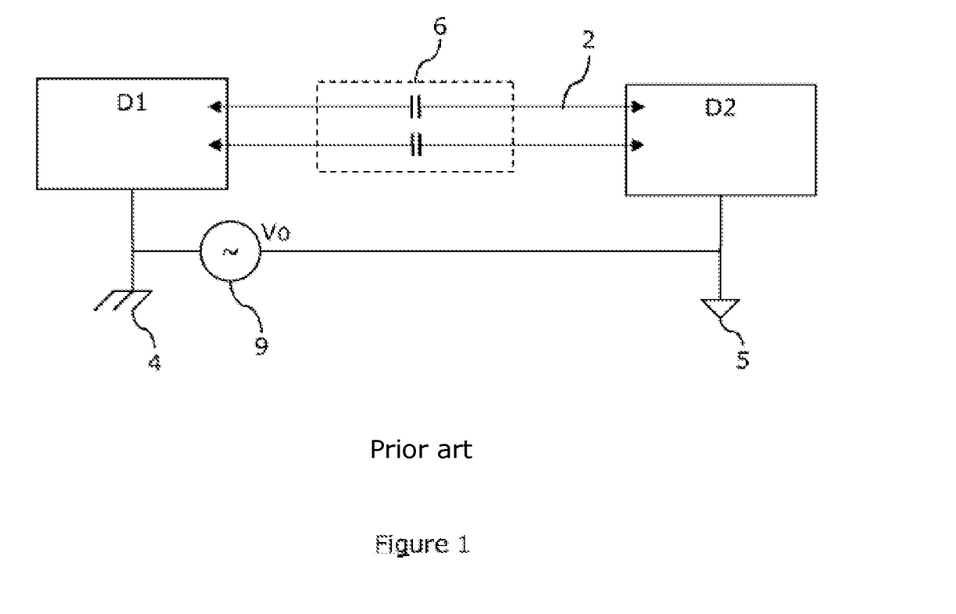
FIG. 1 shows an embodiment, representative of the prior art, of a device for generating an alternating voltage difference between reference potentials of electronic systems.

With reference to FIG. 1, the context of the invention is that of applications or of electronic systems necessitating the interconnection of electronic systems D1, D2 of which the reference potentials 4, 5 are separated by a periodic alternating potential difference Vo. This potential difference Vo can be of any waveform, for example sinusoidal, square or triangular.

This situation occurs for example, in electronic measuring systems. According to a frequent but non-limitative configuration, the electronic system comprises:

a system D2, electrically referenced to the ground or to the earth 5, which comprises the electrical power supply means of the assembly or which is connected to an electrical power supply system;

another electronic system D1 electrically referenced to a variable reference potential 4, which comprises for example high sensitivity and/or low noise electronic measuring or detection means.

According to a configuration representative of the prior art shown in FIG. 1, the periodic alternating potential difference Vo is generated by an excitation alternating voltage source 9 which connects (directly or indirectly) the ground 5 and the floating or variable reference 4, in such a way as to make the variable reference voltage 4 oscillate with respect to the ground 5.

The electronic systems D1 and D2 are connected by electrical links 2 which allow the passage for example of digital or analogue signals. These electrical links 2 are provided with decoupling means 6 in order to ensure isolation between the reference potentials 4 and 5, at least within a frequency range. These decoupling means 6 can comprise for example inductances inserted in series on the lines or differential operational amplifiers. They can also comprise capacitors, which constitute an advantageous solution in a context of production of circuits in the form of integrated circuits, or differential operational amplifiers.

The electronic system D1 having the variable reference potential 4 can be supplied by transferring electrical power supplies from the system having the ground potential D2, for example through electrical links 2 provided with decoupling means 6. In this case, these decoupling means 6 must be able to allow power to pass at low frequency, which involves the use of components such as inductances or transformers, which are penalizing in terms of integration in integrated circuits.

It is also known to use DC/DC converters, but these are also penalizing in terms of space requirement in integrated circuits.

The supplying of the electronic system D1 having the variable reference potential 4 therefore presents particular constraints for production in integrated circuit or ASIC (Application Specific Integrated Circuit) form.

In order to limit these constraints, it is necessary to minimize the electrical power consumed by the electronic system D1 having the variable reference potential 4, which allows the use of power supply systems using components that are more easily integrated.

From this point of view, the excitation source 9 often consumes significant power, because it must be capable of supplying a current adapted to its load impedance, represented in particular by the decoupling means 6 in parallel.

For the purpose of generating the variable potential 4, this excitation source 9 can be referenced equally well to this variable reference potential 4 or to the ground potential 5. It is then supplied, respectively, by a power supply referenced to the variable reference potential 4 or to the ground potential 5.

However, it is often preferable to use an excitation source 9 referenced to the variable reference potential 4. This is particularly the case when this excitation source 9 is also used as an oscillator for the floating part (for a synchronous detection, or as an excitation signal for example). This configuration is found for example in the configurations described in FR 2 756 048.

Figure 2:
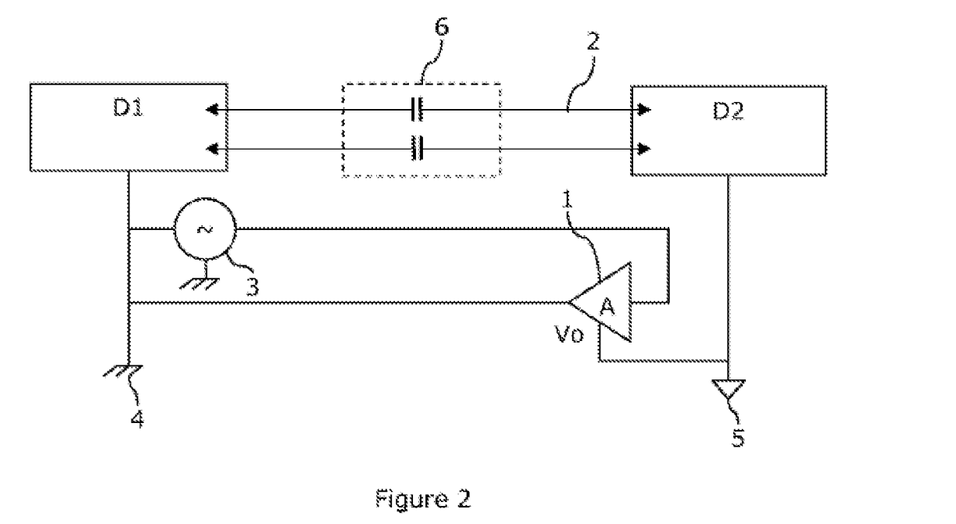
FIG. 2 shows an embodiment of a device according to the invention for generating an alternating voltage difference between reference potentials of electronic systems.

With reference to FIG. 2, a purpose of the invention is precisely to propose a device for generating the alternating voltage difference Vo between the reference potentials 4, 5 from an oscillator 3 referenced to the variable potential 4, whilst minimizing the electrical consumption of this floating part.

The device according to the invention comprises an oscillator 3 referenced to the variable potential 4. This oscillator generates an alternating signal which can be used as an excitation signal or as a clock signal in the electronic system D1. This signal can be of any waveform (for example sinusoidal, square or triangular) depending on the applications.

The device according to the invention also comprises a buffer 1 referenced to the ground potential 5. This buffer 1 comprises an amplifier or a voltage follower (with specified gain) produced on the basis of transistors arranged in the form of an operational amplifier or amplifiers. The output of the oscillator 3 is connected to the input of the buffer 1. The output of the buffer 1 is connected to the variable reference potential 4.

The buffer 1 provides at its output an excitation signal Vo. As its internal electrical reference (or that of its power supply) is the ground potential 5, it behaves as a voltage source supplying a signal Vo or in other words it generates an alternating voltage difference Vo between the ground 5 and the variable reference potential 4.

By proceeding in this manner, the advantages of an oscillator 3 referenced to the variable potential 4 are obtained but of which the electrical consumption is minimized. In fact, the essential part of the power necessary for exciting the variable reference potential 4 is provided by the buffer 1 which is referenced to the ground potential 5.

Figure 3:
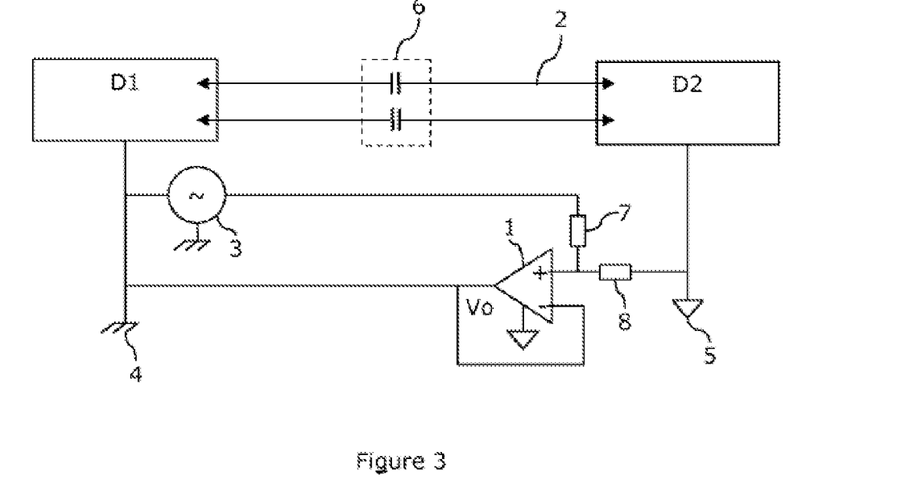
FIG. 3 shows a second embodiment of a device according to the invention for generating an alternating voltage difference between reference potentials of electronic systems.

FIG. 3 shows an example embodiment in which the buffer 1 is produced in the form of an operational amplifier wired as a voltage follower.

The output of the oscillator 3 is connected to the input of the buffer 1 through a resistive divider bridge comprising a resistor 7 inserted between the output of the oscillator 3 and the input of the buffer 1, and a resistor 8 inserted between the input of the buffer 1 and the ground potential 5.

Assuming that the resistor 7 has a value R, that the resistor 8 has a value G×R and that the oscillator 3 provides a voltage Ve, taking account of the fact that the voltage at the input of the buffer 1 is substantially equal to the voltage at its output Vo (since this is a voltage follower), then:

$$Vo=G/(1+G)(Vo+Ve),$$

and therefore $$Vo=G\times Ve.$$

A gain G has thus been introduced in the loop which makes it possible to use an oscillator 3 supplying a voltage Ve very much lower than the voltage difference Vo necessary between the reference potentials 4, 5. In particular, this makes it possible to further minimize the consumption of the oscillator 3.

Devices according to the invention can be advantageously used in a large variety of electronic systems which necessitate grounds 4, 5 at different potentials but not necessarily isolated.

The device according to the invention is particularly well suited for producing the excitation of the floating part of a floating bridge capacitive measuring system such as described for example in the document FR 2 756 048 by Rozière. In fact, in this application, the detection circuit comprises a floating part of which the reference potential, called the guard potential, oscillates with respect to the ground of the overall system, or to the earth. The alternating potential difference between the guard potential and the ground is generated by an oscillator referenced to the guard potential.

Figure 4:
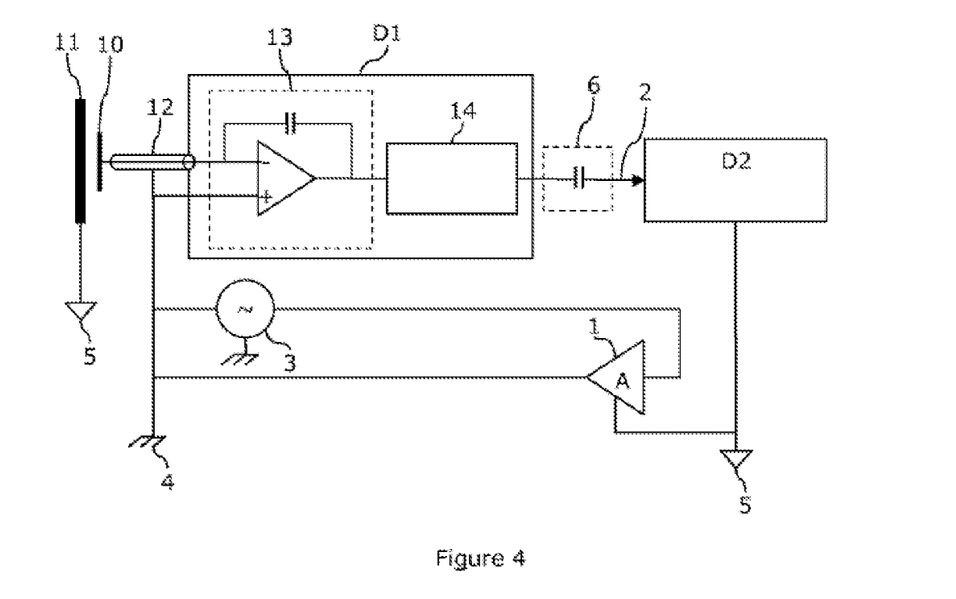
FIG. 4 shows an embodiment of an electronic capacitive measuring system using a device according to the invention for generating an alternating voltage difference between the reference potentials of different electronic sub-systems.

FIG. 4 shows an example of configuration of a floating bridge capacitive measuring system such as described in the document FR 2 756 048, in capacitance measuring mode, to which has been added an excitation device according to the invention.

Such a capacitive measuring system makes it possible to measure capacitance information between at least one measuring electrode 10 and a target 11 at a potential connected to the ground potential 5.

It comprises a floating part D1, referenced to a guard potential 4 oscillating with respect to the ground potential 5, and a part D2 referenced to the ground potential 5.

An oscillator 3 referenced to the guard potential 4 and a buffer 1 referenced to the ground potential 5 provides the excitation of the guard potential 4 according to the invention.

A guard electrode 12 protects the measuring electrode 10. As it is at the same potential as the latter, it prevents the appearance of parasitic capacitances. The measuring electrode 10 is connected to a charge amplifier 13 which makes it possible to measure the capacitance.

Depending on the applications, the floating part of the electronics D1 can comprise other stages of processing of the signal 14, in order for example to provide a signal representative of a distance between the measuring electrode 10 and the target 11. The system can moreover comprise several electrodes 10 of all geometries. It can also comprise a scanner inserted between the electrodes 10 and the charge amplifier 13 and making it possible to measure the capacitance of these electrodes 10 sequentially.

The parts D1 and D2 are connected by electrical links 2 which make it possible to convey digital or analogue signals. These electrical links 2 are provided with decoupling means 6 (for example capacitors, which can be integrated easily) in order to provide isolation between the ground and guard potentials, at least within a frequency range.

A floating bridge capacitive measuring system such as described in FIG. 4 in particular makes it possible to produce touch-sensitive or contactless interfaces for devices such as mobile telephones (smartphones), tablets or computers. The electrodes 10 can be transparent electrodes, for example made of ITO (tin-doped indium oxide), deposited on a display screen or a touch pad. They are then used for detecting the approach and/or the contact of a control object 11 such as a finger.

In this case, the integration of the electronics in the form of integrated circuits or ASICs of minimum overall dimensions is fundamental and the invention assumes all of its importance.

Figure 5:
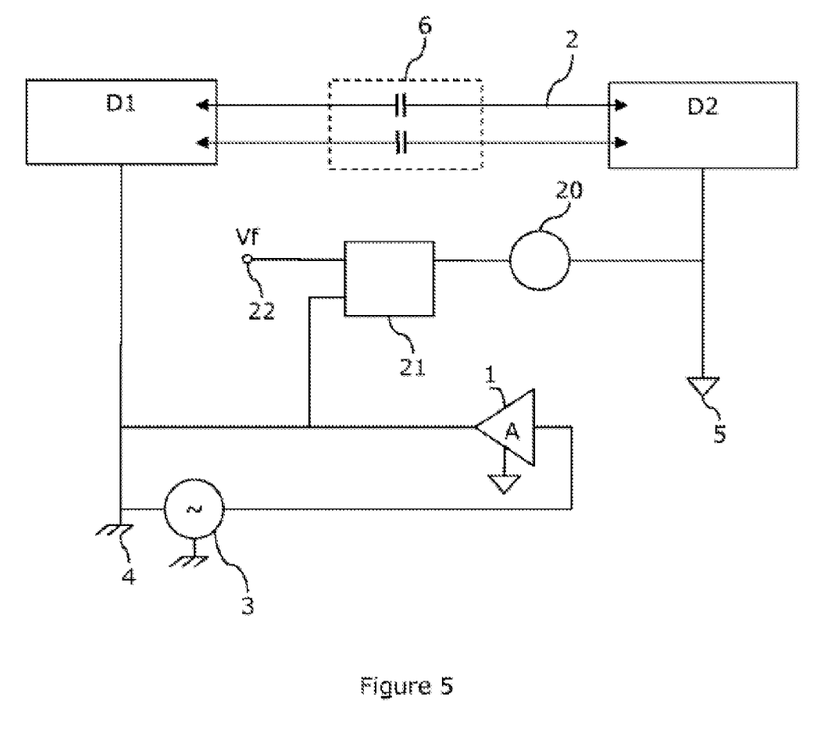
FIG. 5 shows an embodiment of a device according to the invention comprising power supply transfer means.

With reference to FIG. 5, a purpose of the invention is also to propose systems for generating power supply sources Vf referenced to the variable reference potential 4 which are favourable in terms of integration in integrated circuits, precisely by making use of at least one of the advantages provided by the invention, namely:
- a minimizing of the consumption of the oscillator 3 referenced to the variable potential 4,
- the possibility of using the output of the buffer 1, which behaves like a low-impedance voltage source, as a return path between the variable reference potential 4 and the ground potential 5 for a primary power supply source 20 referenced to the ground potential 5.

The power supply sources according to the invention therefore comprise, in general terms:
- a primary power supply source 20, referenced to the ground potential 5, and
- power supply transfer means 21, which are connected at their input to the primary power supply source 20 and the output 22 of which is a power supply source Vf referenced to the variable reference potential 4.

If necessary, the return path to the source 20 (or the ground potential 5 to which it is connected) is carried out through the output of the buffer 1.

The buffer 1, controlled by the oscillator 3, in fact makes it possible to produce a return from the power supply circuit through a link between the variable reference potential 4 and the ground potential 5, without short-circuiting these reference potentials at the frequencies of the excitation signal of the oscillator 3. This effect is obtained as explained previously thanks to the Thevenin generator operation of the buffer 1 controlled by the oscillator 3, which imposes the excitation signal between the variable 4 and ground 5 reference potentials, whilst having a low impedance.

The power supply source Vf according to the invention can in particular be used for supplying the oscillator 3 and, in the capacitive measuring system shown in FIG. 3, for example the charge amplifier 13.

Figure 6:
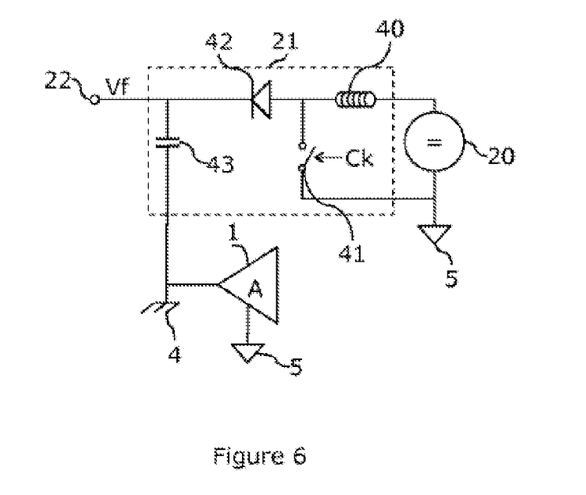
FIG. 6 shows a first embodiment of power supply transfer means.
Figure 7:
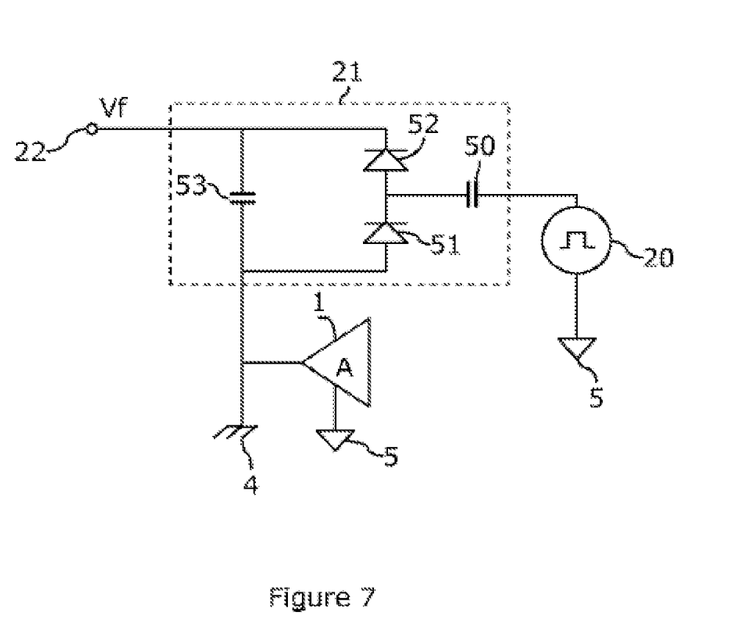
FIG. 7 shows a second embodiment of power supply transfer means.

FIGS. 6 and 7 show non-limitative examples of power supply sources Vf according to the invention.

FIG. 6 shows an example embodiment of a power supply source according to the invention, according to a voltage raising chopper principle.

It comprises an inductance 40 connected to a substantially DC primary power supply source 20. An electronic switch 41 actuated by a periodic signal periodically opens and closes the circuit of the inductance 40 and of the primary source 20, which has the effect of causing voltage variations at the terminals of the inductance 40 as a function of the variation of the current passing through it. A diode 42 eliminates the negative alternations.

According to a principle applicable to all the types of power supply sources according to the invention, the source comprises moreover a smoothing filter comprising a capacitor 43 connected at its output, between the variable reference potential 4 and the supply output 22 of the voltage Vf. The smoothing function can also be carried out by equivalent elements such as parasitic capacitances and/or input impedances of components, and to the extent necessary for the requirements of the use of the power supply voltage Vf.

FIG. 7 shows another example embodiment of a power supply source according to the invention, according to a Schenkel voltage raising rectifier principle. This power supply source comprises:
- a load capacitor 50 connected to a bipolar alternating primary power supply source 20,
- a first diode 51 connected, respectively, to the first reference potential 4 and to the load capacitor 50,
- a second diode 52 connected, respectively, to the load capacitor 50 and to the power supply output 22,
- filtering means comprising at least one filtering capacitor 53 connected to the power supply output 22 and to the first reference potential 4, respectively.

According to variants of the invention,
- the signal of the oscillator 3 can be sinusoidal, square or of any other waveform;
- the oscillator 3 can be a symmetrical bipolar oscillator delivering a signal comprised between a positive value and a negative value, or it can be single-pole asymmetrical, delivering a signal comprised between a maximum or minimum value and the reference potential 5;
- the oscillator 3 can be of analogue or digital type, for example of the DDS (Direct Digital Synthesis) type;
- the buffer 1 can comprise any type of electronic assembly making it possible to produce an amplifier or a voltage follower, with unit gain, amplification or attenuation;
- any means of power supply transfer 21 making it possible to generate one or more power supply voltages Vf referenced to the variable potential 4 can be used in the context of the invention. They can comprise, non-limitatively, charge transfer systems, charge pump systems, voltage multiplier or attenuator systems, produced by association of capacitors and diodes or by any other means;

The invention can also be used in very varied applications, among which the following can be mentioned in particular:
- all types of floating bridge capacitive electronics, with all types of signal processing such as filters, synchronous analogue or digital demodulations, analogue/digital converters (ADC), control devices for producing bridges for measuring capacitance C or inverse capacitance 1/C, control of switches for sequentially scanning several electrodes, etc.;

all capacitive measuring systems or systems based on another physical principle comprising a part having a variable reference potential;

applications where it is necessary to limit parasitic alternating currents between systems and to provide electromagnetic protection (EMC);

all applications necessitating the interconnection of electronic systems of which all or some of the reference voltages are floating with alternating potential differences;

all electronic systems comprising parts referenced to different potentials, one energized with respect to the other by an oscillator, it being possible for these reference potentials to all be floating or variable with respect to a ground or an earth, and the oscillator being able to be referenced to a potential connected to a ground or an earth or floating with respect to a ground or an earth.

Of course, the invention is not limited to the examples which have just been described and numerous adjustments can be made to these examples without exceeding the scope of the invention.

The invention claimed is:

1. Device for generating an alternating voltage difference (Vo) between a first and a second reference potential (4, 5), comprising an oscillator (3) electrically referenced to the first reference potential (4), characterized in that it comprises moreover a voltage follower/amplifier device (1) electrically referenced to the second reference potential (5) and having an input connected to the oscillator (3) and an output connected to the first reference potential (4) in such a way as to be able to impose an alternating voltage difference (Vo), which depends on the signal generated by the oscillator (3), between said first and second reference potentials (4, 5).

2. Device according to claim 1, characterized in that the voltage follower/amplifier device (1) comprises an operational amplifier.

3. Device according to claim 1, characterized in that it comprises moreover a voltage divider inserted between the oscillator (3) and the input of the voltage follower/amplifier device (1).

4. Device according to claim 3, characterized in that it comprises moreover at least one resistor (7) inserted between the oscillator (3) and the input of the voltage follower/amplifier device (1), and at least one resistor (8) inserted between the input of the voltage follower/amplifier device (1) and the second reference potential (5).

5. Device according to claim 1, characterized in that it comprises moreover power supply transfer means (21) able to generate, at a power supply output (22), an electrical power supply (Vf) referenced to the first reference potential (4), from a primary power supply source (20) referenced to the second reference potential (5).

6. Device according to claim 5, characterized in that it comprises moreover an electric circuit connecting the terminals of the primary power supply source (20) through the output of the voltage follower/amplifier device (1).

7. Device according to claim 5, characterized in that it comprises moreover power supply transfer means (21) arranged as a voltage raising chopper device, comprising:
an inductance (40) connected to a primary substantially DC power supply source (20),
a switch (41) connected, respectively, to the inductance (40) and to the second reference potential (5), so as to be able to open and close the circuit in a cyclic manner,
a diode (21) connected, respectively, to the inductance (40) and to a power supply output (22), and
filtering means (43), comprising at least one filtering capacitor (43) connected to the power supply output (22) and to the first reference potential (4), respectively.

8. Device according to claim 5, characterized in that it comprises moreover power supply transfer means (21) arranged as a voltage-raising rectifier, comprising:
a load capacitor (50) connected to a bipolar alternating primary power supply source (20),
a first diode (51) connected, respectively, to the first reference potential (4) and to the load capacitor (50),
a second diode (52) connected, respectively, to the load capacitor (50) and to the power supply output (22), and
filtering means comprising at least one filtering capacitor (53) connected to the power supply output (22) and to the first reference potential (4), respectively.

9. Device according to claim 1, characterized in that it is produced according to integrated electronics technologies.

10. Electronic capacitive measuring system comprising a first sub-system (D1) electrically referenced to a guard potential (4), a second sub-system (D2) electrically referenced to a ground potential (5), and an oscillator (3) referenced to said guard potential (4), characterized in that it comprises moreover a device according to claim 1 for imposing between said ground (5) and guard (4) potentials an alternating voltage difference (Vo) which depends on the signal generated by the oscillator (3).

11. Electronic capacitive measuring system according to claim 10, characterized in that it comprises moreover a charge amplifier (13) referenced to the guard potential (4) and supplied by power supply transfer means (21) able to generate, at a power supply output (22), an electrical power supply (Vf) referenced to the first reference potential (4), from a primary power supply source (20) referenced to the second reference potential (5).

12. Method for generating an alternating voltage difference (Vo) between a first and a second reference potential (4, 5), comprising a step of generation of a signal by means of an oscillator (3) electrically referenced to the first reference potential (4),
characterized in that it comprises moreover a step of amplification of said signal, by means of a voltage follower/amplifier device (1) electrically referenced to the second reference potential (5) and having an input connected to the oscillator (3) and an output connected to the first reference potential (4), in such a way as to impose between said first and second reference potentials (4, 5) an alternating voltage difference (Vo) depending on said signal generated by the oscillator (3).

13. Device according to claim 2, characterized in that it comprises moreover a voltage divider inserted between the oscillator (3) and the input of the voltage follower/amplifier device (1).

14. Device according to claim 6, characterized in that it comprises moreover power supply transfer means (21) arranged as a voltage raising chopper device, comprising:
an inductance (40) connected to a primary substantially DC power supply source (20),
a switch (41) connected, respectively, to the inductance (40) and to the second reference potential (5), so as to be able to open and close the circuit in a cyclic manner,
a diode (21) connected, respectively, to the inductance (40) and to a power supply output (22), and
filtering means (43), comprising at least one filtering capacitor (43) connected to the power supply output (22) and to the first reference potential (4), respectively.

15. Device according to claim 6, characterized in that it comprises moreover power supply transfer means (21) arranged as a voltage-raising rectifier, comprising:
- a load capacitor (50) connected to a bipolar alternating primary power supply source (20),
- a first diode (51) connected, respectively, to the first reference potential (4) and to the load capacitor (50),
- a second diode (52) connected, respectively, to the load capacitor (50) and to the power supply output (22), and
- filtering means comprising at least one filtering capacitor (53) connected to the power supply output (22) and to the first reference potential (4), respectively.

* * * * *